(12) United States Patent
Uemura

(10) Patent No.: US 6,774,025 B2
(45) Date of Patent: Aug. 10, 2004

(54) METHOD FOR PRODUCING GROUP III NITRIDE COMPOUND SEMICONDUCTOR LIGHT-EMITTING ELEMENT

(75) Inventor: Toshiya Uemura, Nishikasugai-gun (JP)

(73) Assignee: Toyoda Gosei Co., Ltd., Aichi (JP)

(*) Notice: Subject to any disclaimer, the term of this patent is extended or adjusted under 35 U.S.C. 154(b) by 78 days.

(21) Appl. No.: 10/162,256

(22) Filed: Jun. 5, 2002

(65) Prior Publication Data
US 2003/0008425 A1 Jan. 9, 2003

(30) Foreign Application Priority Data
Jun. 6, 2001 (JP) ........................ 2001-170911

(51) Int. Cl.[7] ............ H01L 21/00; H01L 21/28; H01L 21/44
(52) U.S. Cl. .............. 438/604; 438/29; 438/39; 438/46; 438/47; 438/602; 438/605; 438/660; 438/661
(58) Field of Search ............... 438/22, 46, 597, 438/602, 604, 795, 799

(56) References Cited

U.S. PATENT DOCUMENTS

| | | | |
|---|---|---|---|
| 5,767,581 A | 6/1998 | Nakamura et al. | |
| 6,008,539 A | * 12/1999 | Shibata et al. | ............... 257/745 |
| 2001/0024769 A1 | * 9/2001 | Donoghue et al. | ........... 430/329 |

FOREIGN PATENT DOCUMENTS

| | | | |
|---|---|---|---|
| JP | 03-183173 | 8/1991 | |
| JP | 05-013812 | 1/1993 | |
| JP | 10-275934 | 10/1998 | |
| JP | 2002-231507 | * 8/2002 | ............ H01C/7/02 |

* cited by examiner

Primary Examiner—Tuan H. Nguyen
Assistant Examiner—David L. Hogans
(74) Attorney, Agent, or Firm—McGinn & Gibb, PLLC

(57) ABSTRACT

After a p seat electrode is laminated on a light-transmissive electrode, the two electrodes are heated at a relatively low temperature to thereby remove gas (degassing) from between the two electrodes. Then, the two electrodes are alloyed with each other at a high temperature.

21 Claims, 3 Drawing Sheets

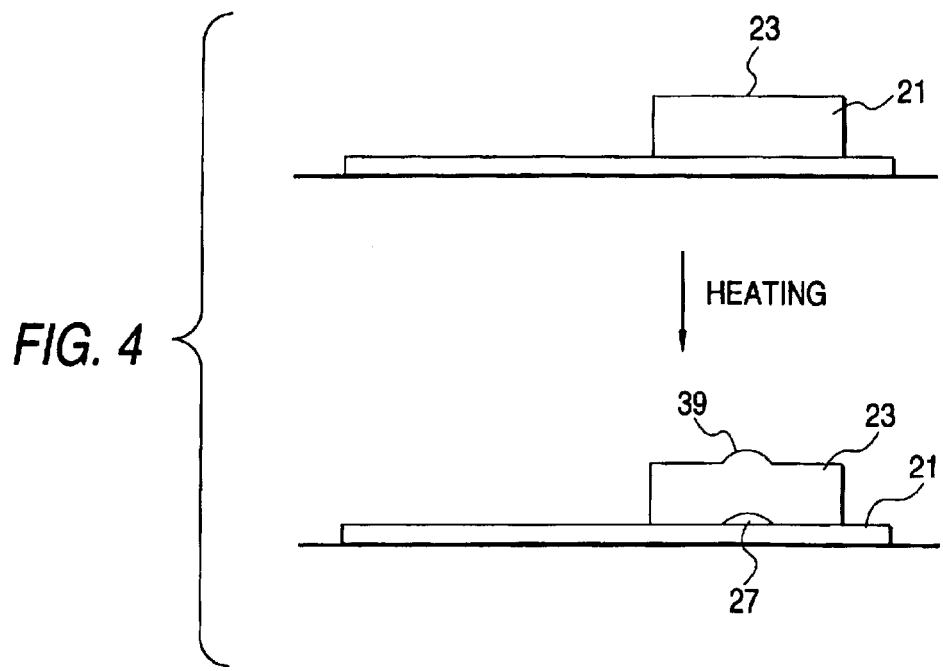

METHOD FOR PRODUCING GROUP III NITRIDE COMPOUND SEMICONDUCTOR LIGHT-EMITTING ELEMENT

The present application is based on Japanese Patent Application No. 2001-170911, which is incorporated herein by reference.

BACKGROUND OF THE INVENTION

1. Field of the Invention

The present invention relates to a Group III nitride compound semiconductor light-emitting element. It is adapted for improvement in electrodes of a Group III nitride compound semiconductor light-emitting element such as a blue light-emitting diode.

2. Description of the Related Art

Various proposals have been made for obtaining uniform light emission from the whole surface of a Group III nitride compound semiconductor light-emitting element such as a blue light-emitting diode.

As a measure to obtain uniform light emission, there is a method in which a p seat electrode is provided on a thin-film light-transmissive electrode stuck onto an upper surface of a p-type layer (Unexamined Japanese Patent Publication No. Hei. 10-275934).

The light-transmissive electrode and the p seat electrode are formed as follows.

First, a material layer for forming a light-transmissive electrode is formed on a p-type layer, for example, by a lift-off method. Then, the material layer for forming a light-transmissive electrode is ashed according to an ordinary method, and a material layer for forming a p seat electrode is likewise formed by a lift-off method.

Then, the two layers are heated to be alloyed with and bonded to each other.

According to the prevent inventor' examination, it has been found occasionally that gas is generated between a material for forming a light-transmissive electrode and a material for forming a p seat electrode when the two materials are heated to be alloyed with each other. There has been a fear that sufficient adhesion or ohmic contact cannot be obtained between the p seat electrode and the light-transmissive electrode because the p seat electrode is swollen by the gas after alloying.

According to a trial to find the cause of generation of the gas, it has been found that gas is generated because so-called contaminant (organic matter, resist residue, etc.) deposited on a surface of the material for forming the light-transmissive electrode is decomposed by the temperature on the basis of heating for alloying.

It may be conceived that strict control over the ashing condition or the like can prevent the contaminant from being deposited on the surface. It is, however, actually difficult to remove the contaminant thoroughly because the step condition (the state of an apparatus, the environmental factor in a clean room, the characteristic of each semiconductor layer, etc.) fluctuates.

SUMMARY OF THE INVENTION

The invention is the fruit of the inventor's eager examination for solving the problem. That is, the invention is configured as follows.

A method of producing a Group III nitride compound semiconductor light-emitting element, including the steps of:

laminating a p seat electrode on a light-transmissive electrode;

removing gas (degassing) from between the light-transmissive electrode and the p seat electrode; and alloying the light-transmissive electrode and the p seat electrode with each other after the degassing step is carried out.

According to the producing method of the invention, the p seat electrode is prevented from being swollen because gas is removed from between the light-transmissive electrode and the p seat electrode before the two electrodes are alloyed with each other. Hence, sufficient adhesion is obtained between the light-transmissive electrode and the p seat electrode as well as ohmic characteristic is secured between the two electrodes.

Features and advantages of the invention will be evident from the following detailed description of the preferred embodiments described in conjunction with the attached drawings.

BRIEF DESCRIPTION OF THE DRAWINGS

In the accompanying drawings:

FIG. 4 is a typical view showing a swollen state.

DETAILED DESCRIPTION OF THE PREFERRED EMBODIMENTS

Figure 1:
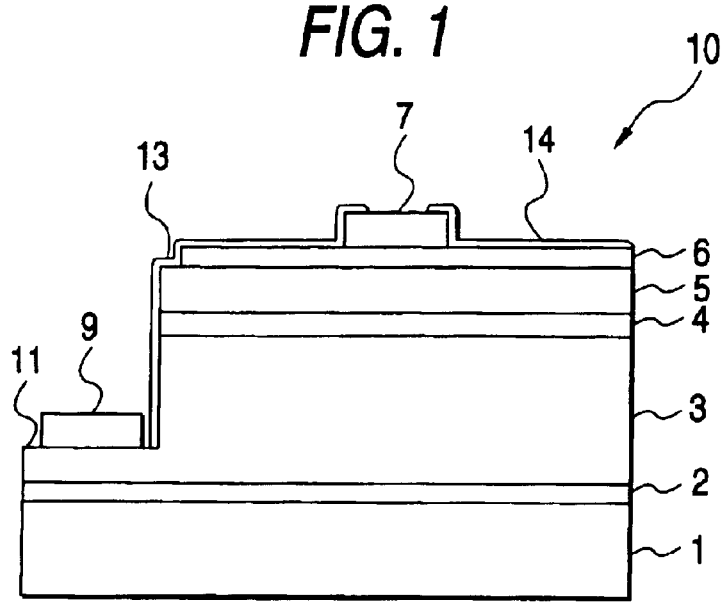
FIG. 1 is a sectional view for explaining the layer configuration of a light-emitting element according to an embodiment of the invention.

The invention will be described below in detail.

(Light-transmissive Electrode)

Materials for forming the light-transmissive electrode are not particularly limited. For example, a Co layer as a first electrode layer and an Au layer as a second electrode layer are laminated in ascending order.

It is preferable that the constituent element of the first electrode layer is lower in ionization potential than that of the second electrode layer, and that the constituent element of the second electrode layer is better in ohmic characteristic to semiconductor than that of the first electrode layer. These electrode layers are also heated to be alloyed with the p-type contact layer. When these electrode layers are heated, the elemental distribution in a depthwise direction viewed from a semiconductor surface is formed so that the constituent element of the second electrode layer penetrates more deeply than that of the first electrode layer. That is, the elemental distribution of the heated electrode layers is reversed to that at the point of time when the electrode layers are formed. After the electrode layers are formed, the constituent element of the second electrode layer formed on the upper side is turned to the lower side whereas the constituent element of the first electrode layer formed on the lower side is turned to the upper side.

Preferably, the constituent element of the first electrode layer is at least one member selected from the group consisting of nickel (Ni), cobalt (Co), iron (Fe), copper (Cu), chromium (Cr), tantalum (Ta), vanadium (V), manganese (Mg), aluminum (Al), and silver (Ag). The thickness of the first electrode layer is selected to be in a range of from 0.5 to 1.5 nm. The constituent element of the second electrode layer is at least one member selected from the group consisting of palladium (Pd), gold (Au), iridium (Ir), and platinum (Pt). The thickness of the second electrode layer is selected to be in a range of from 3.5 to 25 nm. Most preferably, Co is selected as the constituent element of the first electrode layer and Au is selected as the constituent element of the second electrode layer. In this case, the elemental distribution in a depthwise direction viewed from a semiconductor surface is changed by heating so that Au penetrates more deeply than Co.

(p Seat Electrode)

Materials for forming the p seat electrode are not particularly limited. For example, a Cr layer as a first metal layer, an Au layer as a second metal layer and an Al layer as a third metal layer are laminated in ascending order.

The first metal layer is made of an element lower in ionization potential than that of the second metal layer so that the first metal layer can be firmly bonded to the layer under the first metal layer. The second metal layer is made of an element which is good in bonding characteristic to Al or Au and which is not reactive to the light-transmissive electrode. The third metal layer is preferably made of an element which can be firmly bonded to the protective film.

Preferably, the constituent element of the first metal layer is at least one member selected from the group consisting of nickel (Ni), iron (Fe), copper (Cu), chromium (Cr), tantalum (Ta), vanadium (V), manganese (Mg), and cobalt (Co). The thickness of the first metal layer is selected to be in a range of from 1 to 300 nm.

Preferably, the constituent element of the third metal layer is at least one member selected from the group consisting of aluminum (Al), nickel (Ni), and titanium (Ti). The thickness of the third metal layer is selected to be in a range of from 1 to 30 nm.

Preferably, the constituent element of the second metal layer is gold (Au). The thickness of the second metal layer is selected to be in a range of from 0.3 to 3 $\mu$m.

An irregularity is preferably provided around the p seat electrode in order to increase the contact area between the light-transmissive electrode and the p seat electrode.

The circumferential surface of the p seat electrode is preferably inclined. When the circumferential surface of the seat electrode is tapered, the protective film (such as an $SiO_2$ film) formed on respective surfaces of the p seat electrode and the light-transmissive electrode can be also formed on the tapered portion while the film thickness is formed into an approximately designed thickness.

(Group III Nitride Compound Semiconductor Layer)

The light-transmissive electrode is formed on the p-type layer (p-type contact layer) in Group III nitride compound semiconductor layers. In this specification, the Group III nitride compound semiconductors are represented by the general formula $Al_X Ga_Y In_{1-X-Y} N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_X Ga_{1-X} N$, $Al_X In_{1-X} N$ and $Ga_X In_{1-X} n$ ($0<X<1$). The group III elements may be partially replaced by boron (B), thallium (Tl), etc. The nitrogen (N) may be partially replaced by phosphorus (P), arsenic (As), antimony (Sb), bismuth (Bi), etc. Each of the Group III nitride compound semiconductor layers may contain any optional dopant. Si, Ge, Se, Te, C, etc. may be used as n-type impurities. Mg, Zn, Be, Ca, Sr, Ba, etc. may be used as p-type impurities. Incidentally, after doped with p-type impurities, the Group III nitride compound semiconductor maybe subjected to electron beam irradiation, plasma irradiation or heating in a furnace. This step is not always essential. The method for forming the Group III nitride compound semiconductor layers is not particularly limited. For example, the Group III nitride compound semiconductor layers may be formed by a metal organic chemical vapor deposition method (MOCVD method) or may be formed by a known method such as a molecular beam epitaxy method (MBE method), a halide vapor phase epitaxy method (HVPE method), a sputtering method, an ion-plating method, or an electron shower method.

Incidentally, a homostructure, a heterostructure or a double heterostructure may be used as the structure of the light-emitting element. A quantum well structure (single quantum well structure or multiple quantum well structure) may be also used as the structure of the light-emitting element.

(Vapor Deposition of Electrode)

When Group III nitride compound semiconductor layers are laminated on an electrically insulating substrate such as a sapphire substrate, the Group III nitride compound semiconductor layers are partially etched so that the n-type layer is revealed. Then, the light-transmissive electrode vapor-deposited is patterned by use of a photo resist.

After an ashing step, the p seat electrode vapor-deposited is patterned by use of a photo resist in the same manner as described above.

Then, the n-type electrode is vapor-deposited in the same manner as described above. For example, an aluminum alloy such as a vanadium-aluminum alloy is used as the material for forming the n-type electrode.

(Degassing and Alloying of Electrode)

In a general method for producing a light-emitting element, the materials vapor-deposited for forming the respective electrodes are heated to be alloyed in accordance with the ordinary method as described above.

Heating is preferably performed in an atmosphere of oxygen-containing gas. On this occasion, at least one member selected from the group consisting $O_2$, $O_3$, CO, $CO_2$, NO, $N_2O$, $NO_2$, and $H_2O$ or a mixture gas of members selected from the same group may be used as the oxygen-containing gas. Alternatively, a mixture gas of an inert gas and at least one member selected from the group consisting of $O_2$, $O_3$, CO, $CO_2$, NO, $N_2O$, $NO_2$, and $H_2O$ or a mixture gas between an inert gas and a mixture gas of members selected from the group consisting of $O_2$, $O_3$, CO, $CO_2$, NO, $N_2O$, $NO_2$, and $H_2O$ may be used as the oxygen-containing gas. In short, the "oxygen-containing gas" means a gas containing oxygen atoms or molecules having oxygen atoms.

The atmospheric pressure required at heating is preferably not lower than the pressure under which gallium nitride compound semiconductor is not thermally decomposed at the temperature used for heating. When only $O_2$ gas is used as the oxygen-containing gas, the gas can be introduced in a pressure not lower than the decomposition pressure of gallium nitride compound semiconductor. When a mixture gas of $O_2$ gas and an inert gas is used as the oxygen-containing gas, the sufficient condition is that the total pressure of the mixture gas is not lower than the decomposition pressure of gallium nitride compound semiconductor whereas the partial pressure of $O_2$ gas is not lower than about $10^{-6}$ as high as the total pressure of the mixture gas. In short, the sufficient condition is that a very small amount of oxygen is present in the oxygen-containing gas. Incidentally, the upper limit of the amount of the oxygen-containing gas to be introduced is not particularly limited on the characteristic of electrode alloying. That is, any amount of the oxygen-containing gas may be used if production can be made.

The temperature used for heating is preferably selected to be in a range of from 450 to 650° C., more preferably in a range of from 500 to 600° C.

In this invention, gas removal (degassing) is performed from between the light-transmissive electrode and the p seat electrode before alloying is completed.

The gas originates from contaminant such as the residue of the photo resist. When thermally decomposed, the contaminant is gasified. In the invention, therefore, the step of heating the electrodes to a relatively low temperature (first temperature) compared with the alloying temperature (second temperature) is provided so that gas is removed from between the light-transmissive electrode and the p seat electrode before the two electrodes are alloyed with and bonded to each other.

The p seat electrode (100 μmΦ) was laminated on the light-transmissive electrode in a state in which the residue of the photo resist was intentionally left on the p seat electrode-forming surface. These two electrodes were heated in an oxygen atmosphere while the temperature used for heating was changed. The p seat electrode was observed in this condition. Incidentally, the rate of temperature rise was 500° C./min. After the temperature reached its maximum, standing to cool was performed. The p seat electrode was examined with a microscope as to whether the p seat electrode was swollen or not. Results were as follows. Incidentally, the swelling was bubble-like swelling caused by the gas generated between the light-transmissive electrode and the p seat electrode.

| Maximum temperature (° C.) | Occurrence of Swelling |
|---|---|
| 200 | Absent |
| 250 | Absent |
| 300 | Slightly present |
| 350 | Greatly present |
| 400 | Greatly present |
| 450 | Greatly present |
| 500 | Greatly present |

It is obvious from the results that the residue of the photo resist is gasified at a temperature of not lower than 300° C. It is therefore preferable that the degassing temperature (first temperature) is selected to be in a range of from 300 to 400° C. If the degassing temperature is lower than 300° C., all the residue cannot be gasified so that there is a fear that the still remaining part of the residue may be gasified at the alloying temperature to thereby cause swelling. Moreover, a large time is required for gasifying all the residue of the photo resist at a temperature lower than 300° C., so that throughput is reduced. If the degassing temperature is contrariwise higher than 400° C., the materials for forming the electrodes begin to be alloyed with each other so that there is a fear that the gas may be confined in between the light-transmissive electrode and the p seat electrode undesirably. The further preferred first temperature is in a range of from 330 to 370° C.

Figure 2:
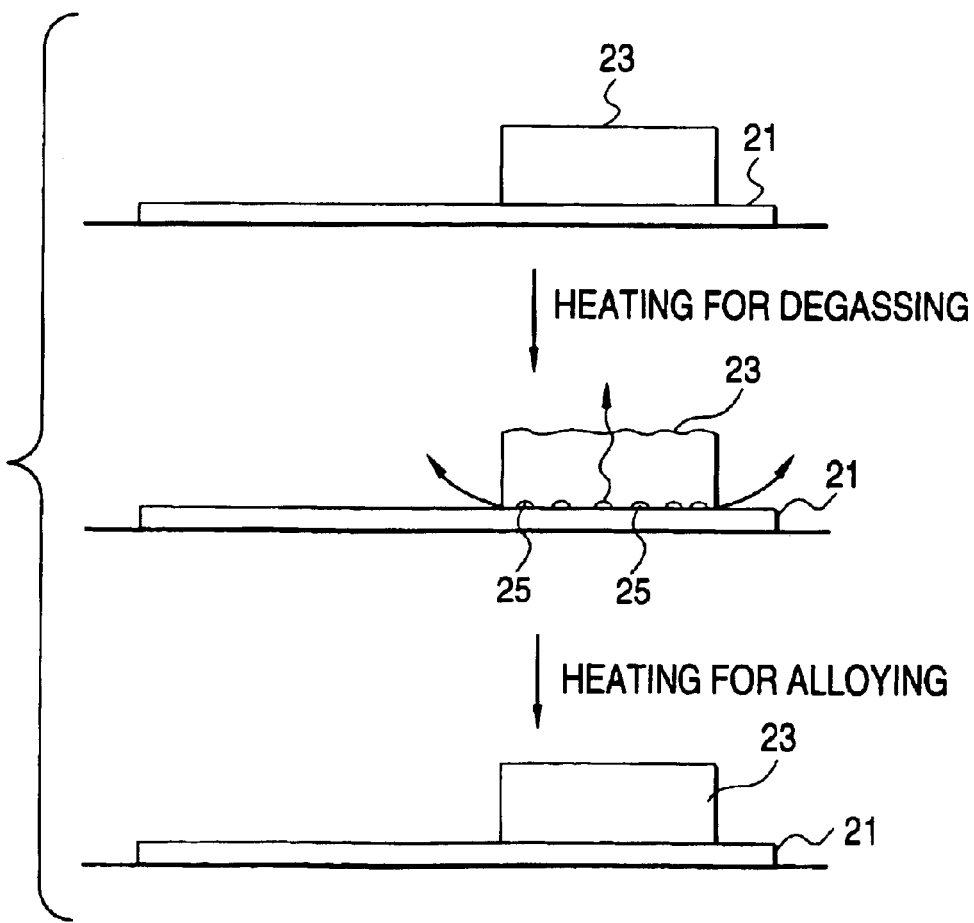
FIG. 2 is a typical view showing a state of degassing.

When the temperature for gasifying was kept for a predetermined time, it was confirmed that bubbles 25 (generated by gasifying the photo resist residue) were generated one after another between the light-transmissive electrode 21 and the p seat electrode 23 as shown in FIG. 2 and moved to the edge of the p seat electrode 23 so as to go out of existence. It is conceived that a part of the gas bubbles 25 may go out through the p seat electrode fluidized by heating.

The temperature for gasifying need not be kept constant for the predetermined time. In this embodiment, the temperature for gasifying gradually increases.

The time (predetermined time) by which the temperature for gasifying is applied is not particularly limited if degassing can be carried out during that time. For example, the time is preferably selected to be in a range of from 0.1 to 60 minutes, more preferably in a range of from 0.3 to 30 minutes, further preferably in a range of from 0.5 to 10 minutes.

The atmosphere used in heating for gasifying is not particularly limited. Because heating will be performed in an oxygen atmosphere in the alloying step following the degassing step, it is preferable that the same oxygen atmosphere is used in the degassing step.

After degassing is completed in this manner, the electrodes are heated to the temperature used for heating so as to be alloyed with each other. An oxidizing atmosphere is used in this step.

An embodiment of the invention will be described below.

FIG. 1 shows the configuration of a light-emitting diode 10 as an embodiment of the invention. Incidentally, FIG. 1 is a view for explaining the structure of layers but not for accurately reflecting the thickness or width proportion of the respective layers.

| Layer | Composition |
|---|---|
| Protective film 14 | $SiO_2$ |
| Light-transmissive electrode 6 | Au (6 nm)/Co (1.5 nm) |
| p-type layer 5 | p-GaN: Mg |
| Light-emitting layer-containing layer 4 | InGaN-containing layer |
| n-type layer 3 | n-GaN: Si |
| Buffer layer 2 | AlN |
| Substrate 1 | Sapphire |

An n-type layer 3 made of GaN doped with Si as n-type impurities is formed on a substrate 1 through a buffer layer 2. Although this embodiment shows the case where a sapphire substrate is used as the substrate 1, the material of the substrate 1 is not limited to sapphire. Examples of the material of the substrate 1 which can be used include sapphire, spinel, silicon, silicon carbide, zinc oxide, gallium phosphate, gallium arsenide, magnesium oxide, manganese oxide, and Group III nitride compound semiconductor monocrystal. Although this embodiment also shows the case where the buffer layer 2 is made of AlN by an MOCVD method, the material of the buffer layer 2 is not limited thereto. For example, GaN, InN, AlGaN, InGaN, or AlInGaN may be used as the material of the buffer layer 2. A molecular beam epitaxy method (MBE method), a halide vapor phase epitaxy method (HVPE method), a sputtering method, an ion-plating method, an electron shower method, etc. may be used as the method for producing the buffer layer 2. When Group III nitride compound semiconductor is used as the substrate 1, the buffer layer 2 can be omitted.

Further, the substrate and the buffer layer maybe removed in accordance with necessity after the formation of the semiconductor element.

Although this embodiment shows the case where the n-type layer is made of GaN, the invention may be applied also to the case where AlGaN, InGaN or AlInGaN is used as the material of the n-type layer.

Although this embodiment shows the case where the n-type layer is doped with Si as n-type impurities, the invention may be applied also to the case where Ge, Se, Te, C, or the like, is used as n-type impurities.

The n-type layer 3 may be of a double-layer structure with an n⁻ layer of low electron density on the light-emitting layer-containing layer 4 side and an n⁺ layer of high electron density on the buffer layer 2 side.

The light-emitting layer-containing layer 4 may contain a light-emitting layer of a quantum well structure. The structure of the light-emitting element may be of a single hetero type, a double hetero type or a homo-junction type.

The light-emitting layer-containing layer 4 may contain a Group III nitride compound semiconductor layer provided on the p-type layer 5 side, doped with an acceptor such as magnesium and having a wide band gap. This arrangement is made for effectively preventing electrons injected into the light-emitting layer-containing layer 4 from diffusing into the p-type layer 5.

The p-type layer 5 made of GaN doped with Mg as p-type impurities is formed on the light-emitting layer-containing layer 4. Alternatively, the p-type layer 5 may be made of AlGaN, InGaN or InAlGaN. Zn, Be, Ca, Sr or Ba may be used as p-type impurities instead.

Further, the p-type layer 5 may be of a double-layer structure with a p⁻ layer of low hole density on the light-emitting layer-containing layer 4 side and a p⁺ layer of high hole density on the electrode side.

In the light-emitting diode configured as described above, each of the Group III nitride compound semiconductor layers may be formed by an MOCVD method in a general condition or may be formed by a method such as a molecular beam epitaxy method (MBE method), a halide vapor phase epitaxy method (HVPE method), a sputtering method, an ion-plating method, or an electron shower method.

Then, a mask is formed and the p-type layer 5, the light-emitting layer-containing layer 4 and the n-type layer 3 are partially removed by reactive ion etching to thereby reveal an n-type electrode-forming surface 11 on which the n-type electrode 9 is to be formed.

A Co layer (1.5 nm) and an Au layer (60 nm) are laminated successively on the whole surface of a wafer by an evaporating system. Then, a photo resist is applied uniformly. The photo resist is removed from a portion (clearance region 13) about 10 μm wide in the n-type electrode-forming surface 11 and its vicinity by photolithography. The light-transmissive electrode-forming material is removed from this portion 13 by etching. Thus, the semiconductor layer is revealed. Then, the photo resist is removed. Incidentally, in this embodiment, ashing is omitted so that gas can be generated easily, and the photo resist residue is left on the p seat electrode-forming surface of the material for forming the light-transmissive electrode.

Then, a Cr layer (30 nm), an Au layer (1.5 μm) and an Al layer (10 nm) are evaporated and laminated successively by a lift-off method to thereby form the p seat electrode 7.

An n-type electrode 9 composed of vanadium and aluminum is also formed by a lift-off method.

Figure 3A:
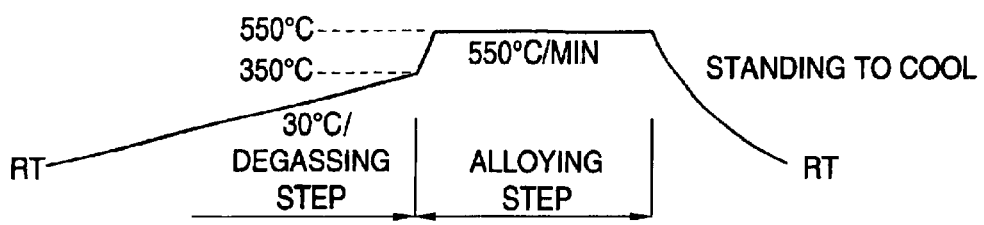
FIG. 3A shows a heat history in heating in an embodiment of the invention.

The sample obtained in this manner is put into a heating furnace. The furnace is evacuated to a pressure not higher than 1 Pa and then O₂ is supplied up to ten and several Pa. Then, as shown in FIG. 3A, heating is performed from this state to 350° C. at a temperature rise rate of 30° C./min. When the temperature reaches 350° C., the temperature rise rate is immediately changed to a temperature rise rate of 500° C./min. Heating is performed to 550° C. at the temperature rise rate of 500° C./min. After the temperature of 550° C. is kept for 5 minutes, standing to cool is performed.

The whole surface except the region of the p seat electrode onto which wire bonding or the like is applied and the upper surface and its circumferential edge portion of the n-type electrode is coated with an electrically insulating and light-transmissive protective film 14 (such as silicon oxide, silicon nitride, titanium oxide or aluminum oxide). A sputtering method or a CVD method can be used as the method for forming the protective film 14.

Figure 3B:
FIG. 3B shows a heat history in heating in a comparative example.

On the other hand, FIG. 3B shows a temperature history in a comparative example. That is, the temperature is raised rapidly from the room temperature to 550° C. at a temperature rise rate of 500° C./min. After the temperature of 550° C. is kept for 5 minutes, standing to cool is performed.

The p seat electrodes in the light-emitting elements (produced from a wafer) obtained in Embodiment and Comparative Example were examined with a microscope. In Embodiment, the swollen state of the p seat electrode was not observed in any chips. On the other hand, in Comparative Example, the swollen state was observed in about 80% of chips. The swollen state is shown in FIG. 4. It can be conceived that the gas generated by gasification of the photo resist residue is confined in between the light-transmissive electrode 21 and the p seat electrode 23 because the two electrodes are alloyed with and bonded to each other before the gas goes out. It can be conceived that the confined gas is collected to form a large bubble 27 so that a swollen portion 39 is generated in the p seat electrode 23.

The invention is not limited at all to the description of the mode for carrying out the invention and the description of the embodiment. The invention includes various modifications that can be conceived easily by those skilled in the art, without departing from the description of the scope of claim.

The following items are disclosed below.

11: A Group III nitride compound semiconductor light-emitting element having a light-transmissive electrode formed on Group III nitride compound semiconductor layers, and a p seat electrode formed on the light-transmissive electrode, wherein the light-transmissive electrode and the p seat electrode are alloyed with each other after degassing from between respective materials for forming the light-transmissive electrode and the p seat electrode.

12: A Group III nitride compound semiconductor light-emitting element according to the item 11, wherein: the light-transmissive electrode is made of a laminate of a first layer of cobalt (Co) or nickel (Ni) and a second layer of gold (Au), the first and second layers being formed on a Group III nitride compound semiconductor layer side; and the p seat electrode is made of a laminate of a first layer of vanadium (V) or nickel (Ni), a second layer of gold (Au) and a third layer of aluminum (Al), said first, second and third layers being formed successively on the light-transmissive electrode side.

What is claimed is:

1. A method of producing a Group III nitride compound semiconductor light-emitting element, comprising:

laminating a p seat electrode on a light-transmissive electrode;

removing gas from between said light-transmissive electrode and said p seat electrode; and alloying said light-transmissive electrode and said p seat electrode with each other after said removing said gas.

2. A method of producing a Group III nitride compound semiconductor light-emitting element according to claim 1, wherein:

heating to a first temperature is carried out in said removing said gas; and heating to a second temperature higher than said first temperature is carried out in said alloying said light-transmissive electrode.

3. A method of producing a Group III nitride compound semiconductor light-emitting element according to claim 2, wherein:

said first temperature is in a range of from 300 to 400° C.; and said second temperature is not lower than 450° C.

4. A method of producing a Group III nitride compound semiconductor light-emitting element according to claim 2, wherein a rate of temperature rise from a heating start to said first temperature is higher than a rate of temperature rise from said first temperature to said second temperature.

5. A method of producing a Group III nitride compound semiconductor light-emitting element according to claim 1, wherein said light-transmissive electrode comprises a gold alloy, and said p seat electrode comprises a gold alloy.

6. A method of producing a Group III nitride compound semiconductor light-emitting element according to claim 1, wherein:

said light-transmissive electrode is made of a laminate of a first layer of one of cobalt and nickel and a second layer of gold, said first and second layers being formed on a Group III nitride compound semiconductor layer side; and said p seat electrode is made of a laminate of a first layer of one of vanadium and nickel, a second layer of gold and a third layer of aluminum, said first, second and third layers being formed successively on the light-transmissive electrode side.

7. A method of producing a Group III nitride compound semiconductor light-emitting element according to claim 1, said removing said gas comprises heating to a first temperature.

8. A method of producing a Group III nitride compound semiconductor light-emitting element according to claim 7, wherein said alloying said light-transmissive electrode and said p seat electrode comprises heating to a second temperature higher than said first temperature.

9. A method of producing a Group III nitride compound semiconductor light-emitting element according to claim 1, wherein said light-transmissive electrode comprises a first layer comprising one of cobalt and nickel and a second layer comprising gold, and wherein said first and second layers are formed successively on a Group III nitride compound semiconductor layer side.

10. A method of producing a Group III nitride compound semiconductor light-emitting element according to claim 1, wherein said p seat electrode comprises a first layer comprising one of vanadium and nickel, a second layer comprising gold and a third layer comprising aluminum, and wherein said first, second and third layers are formed successively on the light-transmissive electrode side.

11. A method of producing a Group III nitride compound semiconductor light-emitting element according to claim 1, wherein said removing said gas comprises heating to a temperature less than an alloying temperature of said p seat electrode and said light-transmissive electrode.

12. A method of producing a Group III nitride compound semiconductor light-emitting element according to claim 1, wherein said p seat electrode comprises a plurality of layers and said light-transmissive electrode comprises a plurality of layers.

13. A method of producing a Group III nitride compound semiconductor light-emitting element according to claim 1, wherein said light-transmissive electrode comprises a first layer having a thickness in a range from 0.5 nm to 1.5 nm and a second layer having a thickness in a range from 3.5 nm to 25 nm.

14. A method of producing a Group III nitride compound semiconductor light-emitting element according to claim 1, wherein said p seat electrode comprises a first layer having a thickness in a range from 1 nm to 300 nm, a second layer having a thickness in a range from 1 nm to 30 nm and a third layer having a thickness in a range from 300 nm to 3000 nm.

15. A method of producing a Group III nitride compound semiconductor light-emitting element according to claim 1, wherein p seat electrode comprises an irregular surface for increasing a contact area between said p seat electrode and said light-transmissive electrode.

16. A method of producing a Group III nitride compound semiconductor light-emitting element according to claim 2, wherein said first temperature is in a range of from 330° C. to 370° C.

17. A method of producing a Group III nitride compound semiconductor light-emitting element according to claim 1, wherein said removing said gas comprises a duration in a range from 0.1 minutes to 60 minutes.

18. A method of producing a Group III nitride compound semiconductor light-emitting element according to claim 1, wherein a rate of increase in temperature in said removing said gas is less than a rate of increase in temperature in said alloying said p-seat electrode and said light-transmissive electrode.

19. A method of producing a Group III nitride compound semiconductor light-emitting element according to claim 1, further comprising:

reducing a pressure in a chamber for forming said light-emitting element to 1 Pa or less; and supplying an oxygen containing gas into said chamber.

20. A method of producing a Group III nitride compound semiconductor light-emitting element, comprising:

forming a p seat electrode on a light-transmissive electrode;

heating to a first temperature to remove a gas from between said light-transmissive electrode and said p seat electrode; and heating to a second temperature higher than said first temperature, to alloy said light-transmissive electrode and said p seat electrode.

21. A method of producing a Group III nitride compound semiconductor light-emitting element according to claim 1, wherein said removing said gas comprises removing said gas by heating.

* * * * *